United States Patent [19]
Long et al.

[11] Patent Number: 5,327,361
[45] Date of Patent: Jul. 5, 1994

[54] EVENTS TRACE GATHERER FOR A LOGIC SIMULATION MACHINE

[75] Inventors: Gerald B. Long; Mark D. Sweet, both of Austin, Tex.

[73] Assignee: International Business Machines Corporation, Armonk, N.Y.

[21] Appl. No.: 502,148

[22] Filed: Mar. 30, 1990

[51] Int. Cl.$^5$ .......................... G06F 7/38; G06F 15/20
[52] U.S. Cl. ...................................... 364/57; 364/133; 395/500
[58] Field of Search ............... 364/488, 489, 578, 131, 364/133; 371/19, 23; 395/500

[56] References Cited

U.S. PATENT DOCUMENTS

| | | | |
|---|---|---|---|
| 3,702,011 | 10/1972 | Armstrong | 364/578 |
| 3,715,573 | 2/1973 | Vogelsberg | 371/26 |
| 4,306,286 | 12/1981 | Cocke et al. | 364/200 |
| 4,527,249 | 7/1985 | Van Brunt | 364/578 |
| 4,644,487 | 2/1987 | Smith | 364/578 |
| 4,656,580 | 4/1987 | Hitchcock et al. | 364/200 |
| 4,697,241 | 9/1987 | Lavi | 364/488 |
| 4,725,975 | 2/1988 | Sasaki | 364/491 |
| 4,727,545 | 2/1988 | Glackemeyer et al. | 364/578 |
| 4,775,950 | 10/1988 | Terada et al. | 364/578 |
| 4,872,125 | 10/1989 | Catlin | 364/578 |
| 4,873,656 | 10/1989 | Catlin | 364/578 |
| 4,914,612 | 4/1990 | Beece et al. | 364/578 |
| 4,937,770 | 6/1990 | Samuels et al. | 371/23 |
| 4,942,615 | 7/1990 | Hirose | 364/578 |
| 4,961,156 | 10/1990 | Takassaki | 364/578 |
| 4,996,659 | 2/1991 | Yamaguchi et al. | 364/578 |

OTHER PUBLICATIONS

*IBM Technical Disclosure Bulletin*, vol. 25, No. 3A, Aug., 1982, pp. 1276–1277, "Parallel Data Adapter for a Logic Simulation Machine".
*IBM Technical Disclosure Bulletin*, vol. 25, No. 3A, Aug., 1982, pp. 1274–1275, "Simple Parallel Adapter for a Logic Simulation Machine".
*IBM Technical Disclosure Bulletin*, vol. 25, No. 1, Jun., 1982, pp. 91–94, "Logic Processor for Logic Simulator Machine".
*IBM Technical Disclosure Bulletin*, vol. 25, No. 11B, Apr., 1983, pp. 5946–5947, "Direct Simulator Attachment".
*Logic Design and Simulation*, 1986, pp. 165–191, "Hardware Engines for Logic Simulation" by Y. Kitamura et al.
*Electronic Design*, Apr. 28, 1988, pp. 31–35, "Simulation Accelerator" by B. W. Phillips.
*IBM Technical Disclosure Bulletin*, vol. 25, No. 11B, Apr., 1983, pp. 5948–5951, "Parallel Adapter for a Logic Simulation Machine".
*IBM Technical Disclosure Bulletin*, vol. 30, No. 1, pp. 340–342, Jun. 1987, "System Verification Using Multiple Independent Simulation Engines Running Under Common Controls".

*Primary Examiner*—Parshotam S. Lall
*Assistant Examiner*—Ellis B. Ramirez
*Attorney, Agent, or Firm*—Thomas E. Tyson; Paul S. Drake

[57] ABSTRACT

An all events trace gatherer for a logic simulation machine is disclosed. The all events trace gatherer generates an all events trace (AET) which is a record of what has happened to all or a subset of the facilities by monitoring a simulation bus on which the logic simulation machine put a calculated result during the simulation thereon. The AET gatherer allows an AET to be gathered without slowing the simulation. The AET gatherer is an auxiliary processor that is connected to the simulation bus in the logic simulation machine in parallel with simulation processors of the machine.

9 Claims, 11 Drawing Sheets

| ADDRESS \ CYCLE | INITIAL | 1 | 2 | 3 |
|---|---|---|---|---|
| Z0 | 0 | 1 | 0 | 1 |
| Z1 | 0 | 0 | 1 | 1 |
| Z2 | 0 | 1 | 0 | 1 |
| Z3 | 0 | 0 | 1 | 1 |

FIG. 13

| NODE ADDRESS | NEW VALUE |
|---|---|
| Z0 | 1 |
| ZZ | 1 |
| END OF CYCLE | 1 |
| Z0 | 0 |
| Z1 | 1 |
| Z2 | 0 |
| Z3 | 1 |
| END OF CYCLE | 2 |
| Z0 | 1 |
| Z2 | 1 |
| END OF CYCLE | 3 |

EVENTS TRACE GATHERER FOR A LOGIC SIMULATION MACHINE

RELATED PATENT APPLICATIONS

Co-pending application U.S. Ser. No. 07/502,147 filed Mar. 30, 1990 and entitled "FIFO Host Interface for a Logic Simulation Machine". Co-pending application U.S. Ser. No. 07/502,088 filed Mar. 30, 1990 and entitled "Broadcast Command for a Logic Simulation Machine". Co-pending application U.S. Ser. No. 07/502,089 filed Mar. 30, 1990 and entitled "Logic Simulation Machine, Method of Logic Simulation, and Method of Compiling a Logic Model for the Machine". All of them are assigned to the same assignee as the present application.

1. Technical Field

The present invention relates to a logic simulation machine for the simulation of digital logic, and in particular, to an all events trace gatherer for the logic simulation machine to generate an all events trace (AET) which is a record of what has happened to all facilities being simulated during the simulation.

2. Background of the Invention

Logic technologies such as very large scale integrated circuits provide significant improvements in cost/performance and reliability. However, they have disadvantages in that their fault diagnosis is more difficult than previous technologies and their engineering rework cycles needed to correct faults in logic design are greatly lengthened. These disadvantages exact great economic penalties for design errors and omissions and place a great emphasis on the goal of completely verifying designs in advance of engineering models.

One technique for providing design verification is logic simulation by a general purpose computer. Another technique is to use a special purpose computer that is optimized for logic simulation. The special purpose computer usually uses a multiple processor architecture by which a number of processors, called simulation processors, may be interconnected to improve simulation performance. The special purpose computer may operate in combination with a host computer which is used to provide loading functions and to analyze the results of the simulation. Such a special purpose computer is called a logic simulation machine. The invention relates to an AET gatherer for the logic simulation machine.

The prior art logic simulation machine is described in U.S. Pat. No. 4,306,286 issued Dec. 15, 1981, to Cocke et al. and assigned in common with the present application. The logic simulation machine of the Cocke et al. patent comprises a plurality of parallel basic processors which are interconnected through an inter-processor switch. The inter-processor switch provides communication not only among the basic processors which are computing engines of the logic simulation machine, each simulating the individual gates of a portion of a logic model in parallel, but also between them and a control processor which provides overall control and input/output facilities of the logic simulation machine through a host computer to which the control processor is attached. Each basic processor contains the current state information for only the set of gates that is being simulated by that processor. When a basic processor simulates a gate whose input includes a connection to the output of a gate being simulated by a different processor, the state information for the gate in question is transferred over the inter-processor switch.

An All Event Trace (AET) is a record of what has happened to all of the facilities during a simulation. The acronym AET is also applied to all traces including those including only a subset of all facilities. The AET data is used by a host computer to analyze the simulation.

In the prior art, the AET data is normally collected by having the host evaluate all of the nodes to be traced at the end of each simulation cycle. Even with the efficiencies of a Broadcast command to send only those nodes to the host from a logic simulation machine, two limitations remain. First, all of the nodes to be traced are sent to the host from the logic simulation machine, even those that did not change. Second, it places a considerable time requirement on the host to evaluate the data every cycle.

DISCLOSURE OF THE INVENTION

Accordingly, it is the primary object of the present invention to provide an all events trace (AET) gatherer which generates an all events trace (AET) record in parallel with the simulation without slowing down the simulation.

It is another object of the invention to provide an AET gatherer which is an auxiliary processor to be connected in parallel with simulation processors to a logic simulation machine to provide an efficient means of collecting an AET.

Also, it is an object of the invention to provide an AET gatherer which allows any subset of facilities to be collected.

In accordance with these and other objects of the present invention, there is provided an AET gatherer comprising, a current state array for storing a complete copy of current states of a whole model being simulated, a change record array for storing only changes in the current states of the model at each simulation cycle, and control means for monitoring current states of the model being simulated to detect a change in the current states stored in the current state array and store the change into the change record array at each simulation cycle.

The AET gatherer is connected to a simulation bus on which each of simulation processors of a logic simulation machine puts a simulated result in parallel at the end of each simulation cycle in order to monitor the simulation.

The AET gatherer may contain a memory unit equal in size to the current state array for tracing any subset of all facilities. The memory unit is used as a mask to store a bit for indicating the node to be traced.

BRIEF DESCRIPTION OF THE DRAWING

For a more complete understanding of the present invention and further objects and advantages thereof, reference is now made to the following Description of the Preferred Embodiments taken in conjunction with the accompanying Drawings, in which.

BEST MODE FOR CARRYING OUT THE INVENTION

Figure 1A:
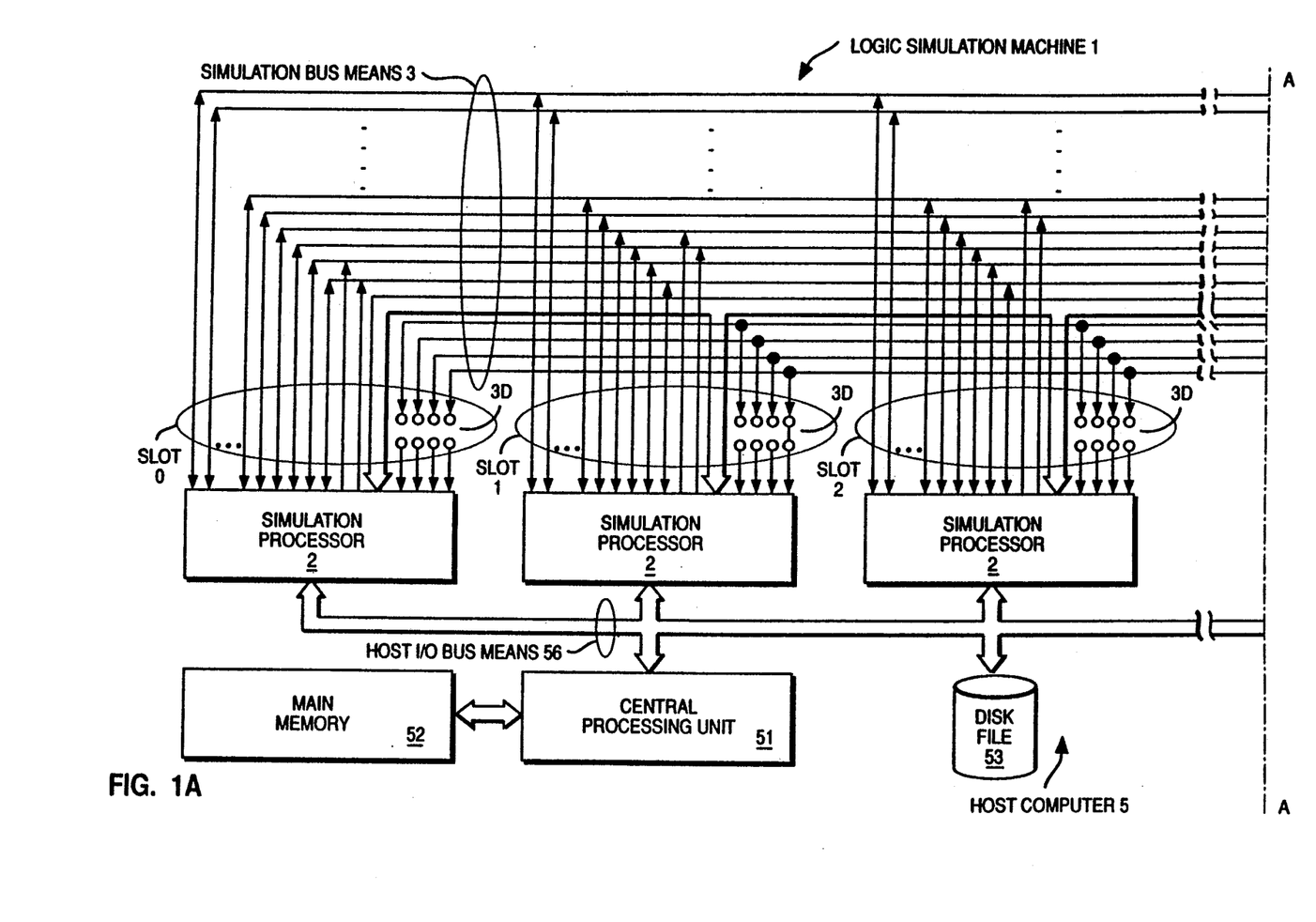
FIGS. 1A-1B are an entire schematic block diagram of a logic simulation machine to which an AET gatherer according to a preferred embodiment of the present invention is attached.
Figure 1B:
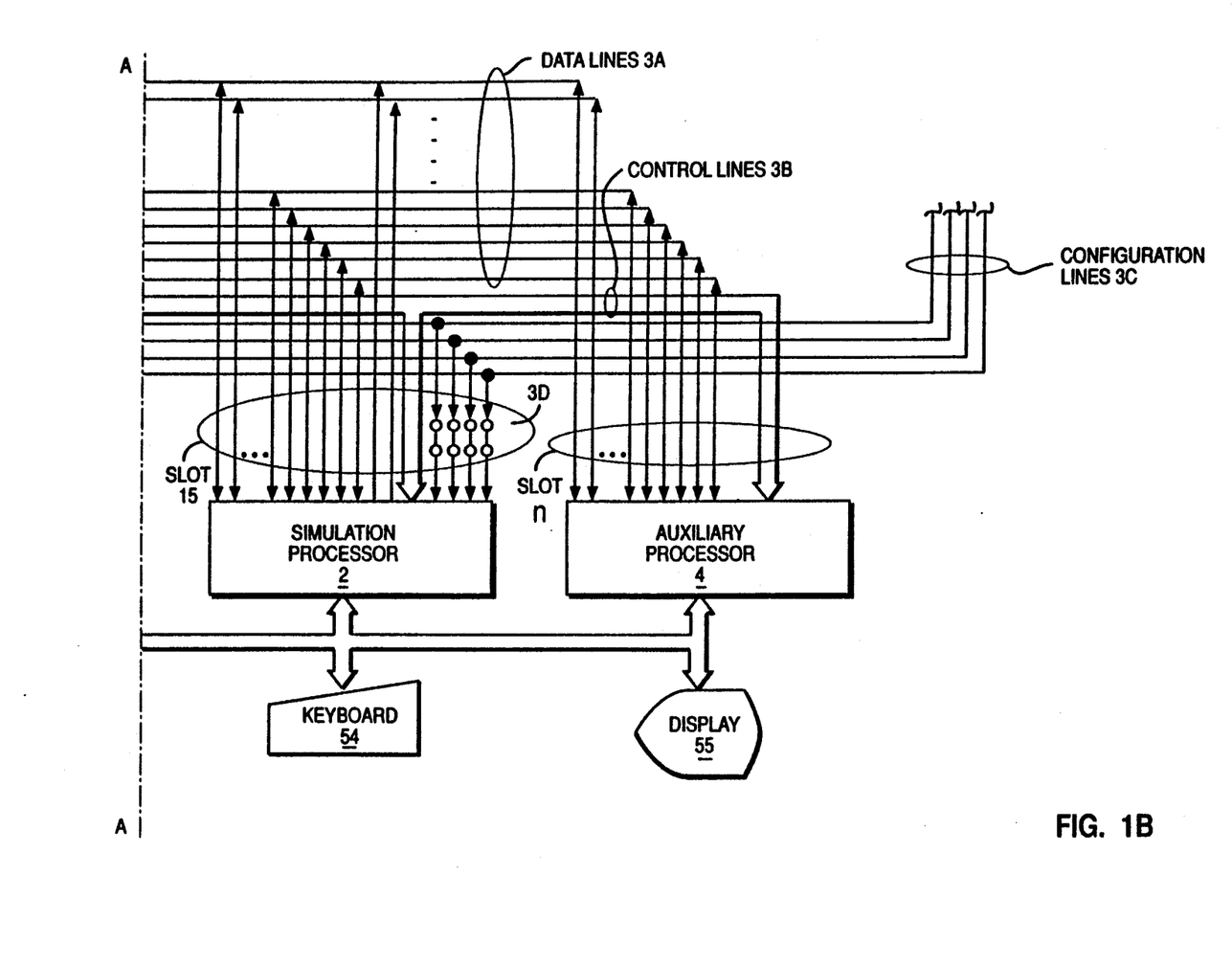

Referring to the block diagram of FIGS. 1A-1B, a logic simulation machine 1 to which an all event trace (AET) gatherer of the invention is attached is explained. The logic simulation machine 1 which is the subject of the co-pending application U.S. Ser. No. 07/502,089 filed Mar. 30, 1990 includes plural simulation processors 2 connected to each other in parallel through a simulation bus means 3. Although four simulation processors 2 are shown in FIG. 1, the number of the simulation processors 2 connected to the simulation bus means 3 is sixteen and sixteen processors are a maximum configuration for explanation purpose. However, any number of simulation processors selected from a group consisting of 1, 2, 4, 8, and 16 is able to be used in the machine 1.

The simulation bus means 3 comprises three parts: data lines 3A through which each simulation processor 2 transfers a simulated result and each simulation processor 2 receives the results from all simulation processors 2 to update its own copy of current states when evaluating gates and through which a host computer 5 transfers packet data to and from the simulation processors 2 when not evaluating gates; control lines 3B through which current contents on the data lines 3A are indicated and arbitration for the bus 3 is done; and configuration lines 3C through which a unique code is transferred to each of the simulation processors 2 to inform the configuration of the simulation processors. The simulation bus means 3 further comprises slot means 0, 1, 2, ..., 15 and n. Each simulation processor 2 is plugged into the slot means 0, 1, 2, ..., or 15 for connection with the simulation bus means 3. Each slot means 0, 1, 2, ..., or 15 of the simulation bus means 3 has a hard wired means 3D associated with the configuration lines 3C. The number of the configuration lines 3C depends on how many simulation processors 2 the logic simulation machine 1 can contain. In this embodiment, the number of the lines 3C is four to convey a different 4-bit binary data to each of the sixteen simulation processors. The hard wired means 3D of the slot means 0 sets all lines of the configuration lines 3C OFF so that the configuration lines 3C input 4-bit binary zero data 0000 into the simulation processor 2 plugged into the slot means 0. The hard wired means 3D of the slot means 1 sets the least significant bit line ON and the other three lines OFF so that the configuration lines 3C input binary data 0001 into the simulation processor 2 plugged into that slot means. The hard wired means 3D of the slot means 2 sets the second least significant bit line ON and the other three lines OFF so that the configuration lines 3C input binary data 0010 into the simulation processor 2 plugged into that slot means and so on. The hard wired means 3D of the slot means 15 sets all lines ON so that the configuration lines 3C input binary data 1111 into the simulation processor 2 plugged into that slot means.

An all events trace (AET) gatherer 4 of the invention which is an auxiliary processor in the machine 1 is plugged into the slot means n of the bus means 3 for connection with the simulation bus means 3 in parallel with the simulation processors 2.

The number of the data lines 3A depends on how many simulation processors 2 the logic simulation machine 1 can contain and how many bits each simulation processor 2 needs to represent a calculated result. In this example, the machine 1 can contain up to sixteen simulation processors 2 and each simulation processor 2 calculates a 2-bit result. Therefore, the number of the data lines 3A is 16×2=32. Each of the simulation processors 2 is allocated two data lines 3A to transfer a result calculated by that processor to all of the simulation processors 2, depending upon which slot means that processor 2 occupies as explained later. The data lines 3A can also be used by the host computer 5 to load data and instructions into each of the simulation processors 2 and the AET gatherer 4 before simulation and to receive the results calculated by the simulation processors 2 and the AET gatherer 4 during the simulation through a host interface provided in one of the simulation processors 2 as explained later.

The host computer 5 may be a conventional engineering workstation. The host computer 5 includes a central processing unit 51, a main memory 52, a disk file (direct access storage device) 53, a keyboard 54, a display 55, and a host I/O bus means 56. Each of the simulation processors 2 and the AET gatherer 4 are connected to the host computer 5 through the I/O bus means 56 by being plugged into slot means (not shown) of the I/O bus means 56. If the number of the simulation processors 2 exceeds the number of the I/O slot means provided within the host computer 5, an extension housing may be used to connect the additional simulation processors to the host computer 5.

The simulation processors 2 and the AET gatherer 4 are provided on rectangular cards. Connector (not shown) for the slot (not shown) of the host I/O bus means 56 is provided at one end of the card on which the simulation processor 2 or the AET gatherer 4 is mounted. Connector (not shown) for the slot means 0, 1, ..., 15 or n of the simulation bus means 3 is provided at the opposite end of the card. The simulation processors 2 and the AET gatherer 4 are installed in the host 5 by directly plugging the connector (not shown) at the one end of the card into the slot (not shown) of the host I/O bus 56. The simulation bus means 3 connects the simulation processors 2 and the AET gatherer 4 by plugging the slot means 0 thru n into the connectors (not shown) at the opposite end of the cards.

Figure 2:
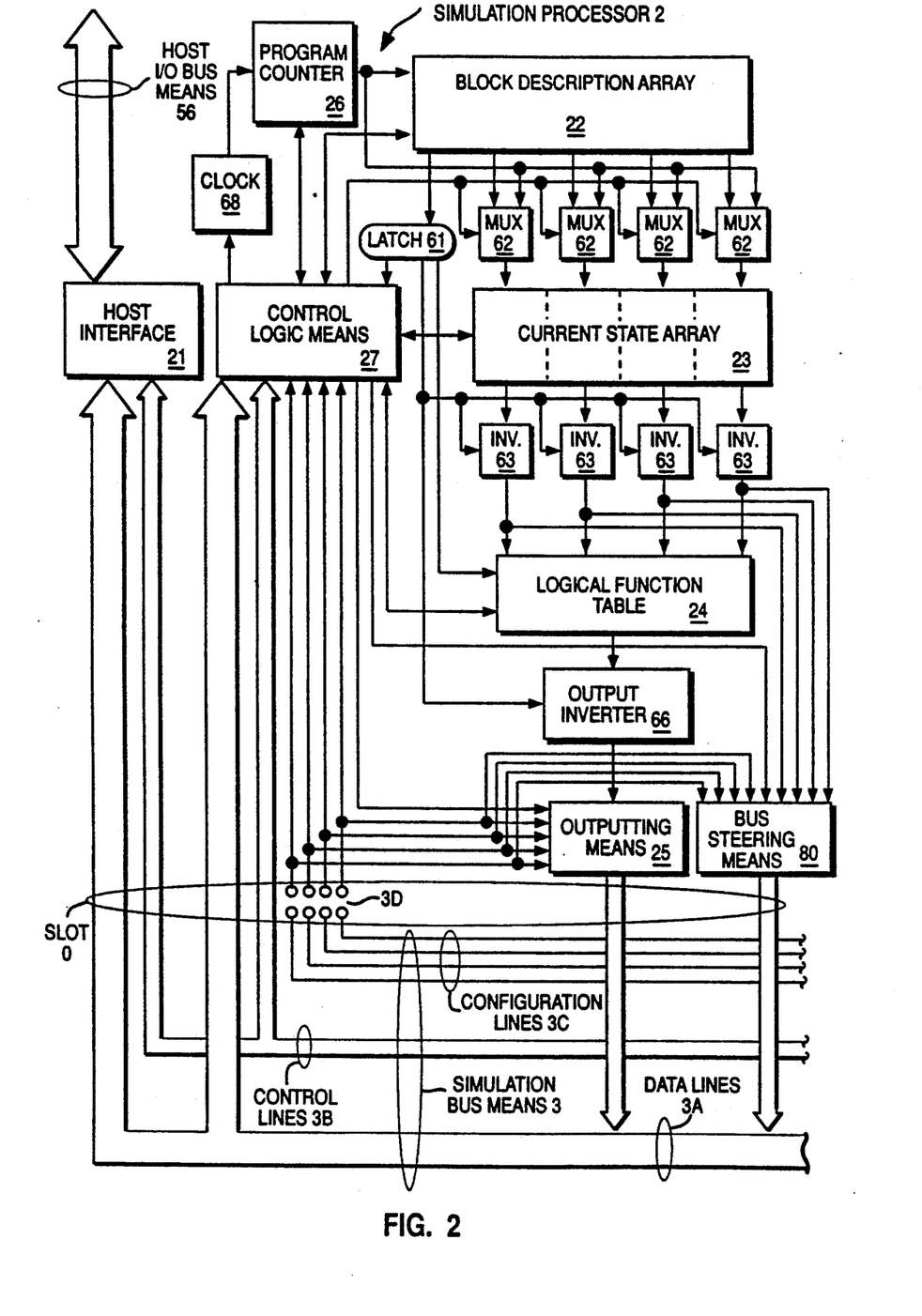
FIG. 2 is a schematic block diagram of the simulation processor plugged into the slot 0 in FIG. 1.

Now, referring to FIG. 2, the structure of the simulation processor 2 plugged into the slot means 0 of the simulation bus means 3 is explained. Other simulation processors 2 have the same structure except a host interface 21. Each simulation processor 2 has seven primary elements: a first memory unit, such as a block description array 22; a second memory unit, such as a current state array 23; a logical function table 24; an outputting means 25; a bus steering means 80; a program counter 26; and a control logic means 27.

Figure 3:
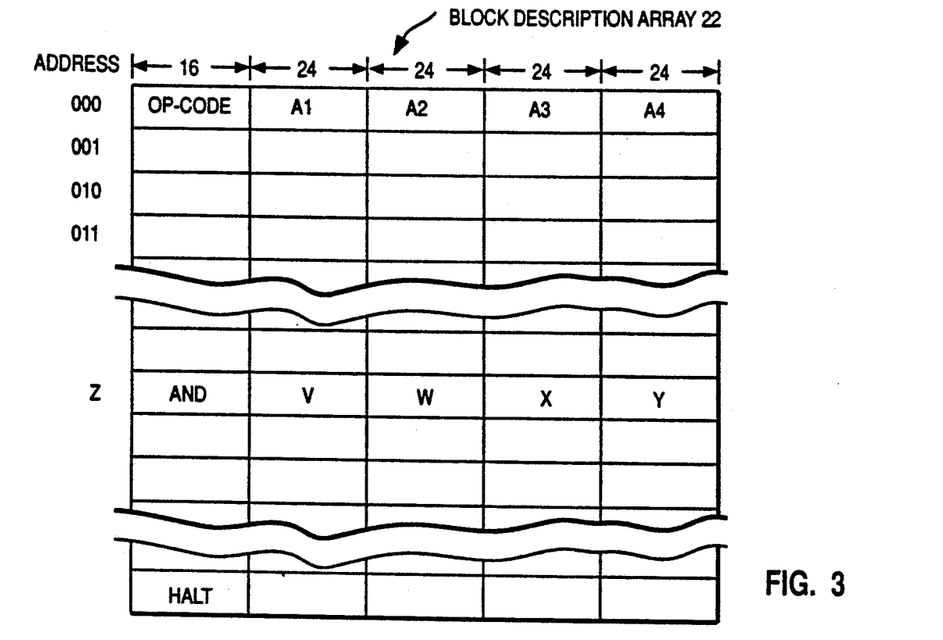
FIG. 3 is a schematic diagram showing contents of a block description array of the simulation processor of FIG. 2.
Figure 4:
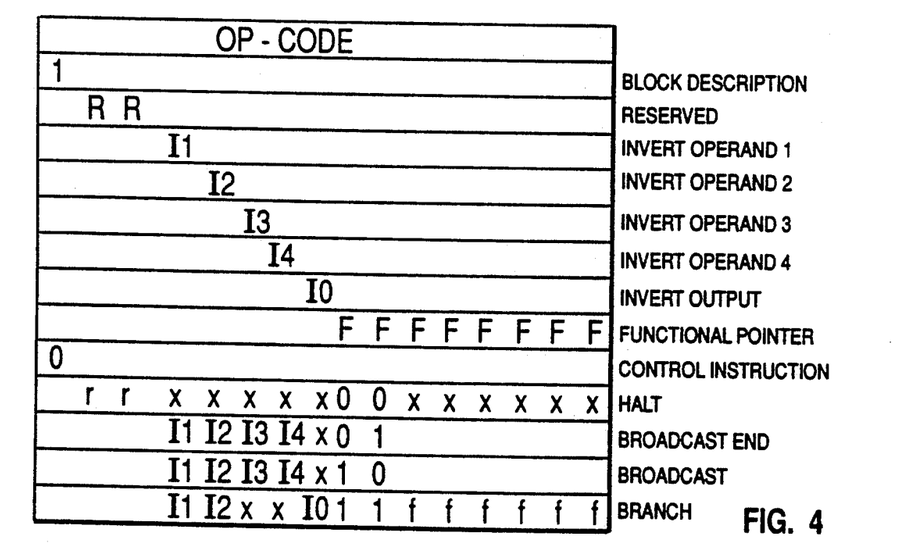
FIG. 4 is a schematic diagram showing the op-code field of instructions stored in the block description array of FIG. 3.

The block description array 22 is an instruction memory for the simulation processor 2 which contains all of the information necessary to specify operations of that simulation. FIG. 3 shows contents of the block description array 22. An instruction stored at one address in the array 22 contains an op-code field (16 bits), A1, A2, A3, and A4 fields (each 24 bits in this embodiment). There are two kinds of instructions determined by the op-code field as shown in FIG. 4, that is, a block description instruction having a binary one at a first bit position of the op-code field for evaluating a gate and a control instruction having a binary zero at the first bit position of the op-code field for controlling operation of that simulation processor.

As to the block description instruction, one instruction word corresponds to each logical block or gate in a model to be simulated. The instruction word's address represents a block or gate identifier. The instruction contains the op-code fields to specify a logical function of the gate, such as AND or OR, and four fields A1, A2, A3 and A4, to specify input connections or input operands of the gate. Thus, a block description instruction corresponds to a single 1-output, 4-input gate. The logical function of the gate is determined by an 8-bit function pointer FFFFFFFF in the op-code which is an index to the logical function table 24. Input/output inversion can be done independent of the logical function table 24 by inversion bits I1, I2, I3, I4, and I0 in the op-code. The fields A1, A2, A3, and A4 represent addresses in the current state array 23 where the four input operands are stored. The block description instruction's address in the block description array 22 implies its output address in the current state array 23 where the calculated result is to be stored. The size of the block description array 22 depends on a desired capacity of the simulation processors 2. In this embodiment, the array 22 can store up to 512K block description instructions.

Figure 5:
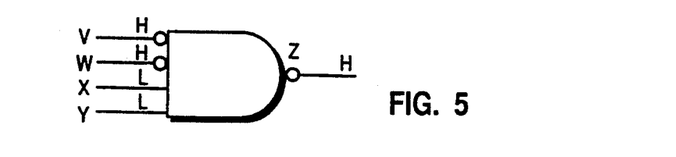
FIG. 5 is a schematic block diagram of a simplified logic circuit model used in explaining a block description instruction and operation of the simulation processor shown in FIG. 2.

FIG. 5 shows an example of a gate to be simulated by the simulation processor 2 in order to illustrate the block description instruction shown at an address Z in FIG. 3. An AND gates is identified by a numeral Z which corresponds to an address in the block description array 22 where the block description instruction of the gate is stored. The AND function pointer and the invert functions of the gate are stored in the op-code field of the instruction. Input connections V, W, X, and Y of this gate are stored in the fields A1, A2, A3 and A4 of the instruction. The current state array 23 stores input operands of the gate Z at addresses V, W, X, and Y designated by the fields A1, A2, A3, and A4.

As to control instructions, the op-code field specifies a control function executed by the simulation processors. As shown in FIG. 4, Halt means to stop the simulation to wait for host interaction. Broadcast means to send any packet of data to the simulation bus means 3 for use by the host and/or an auxiliary processor connected to the simulation bus 3. Branch means to go to an instruction stored in the address designated by the fields A2 and A3.

Figure 6:
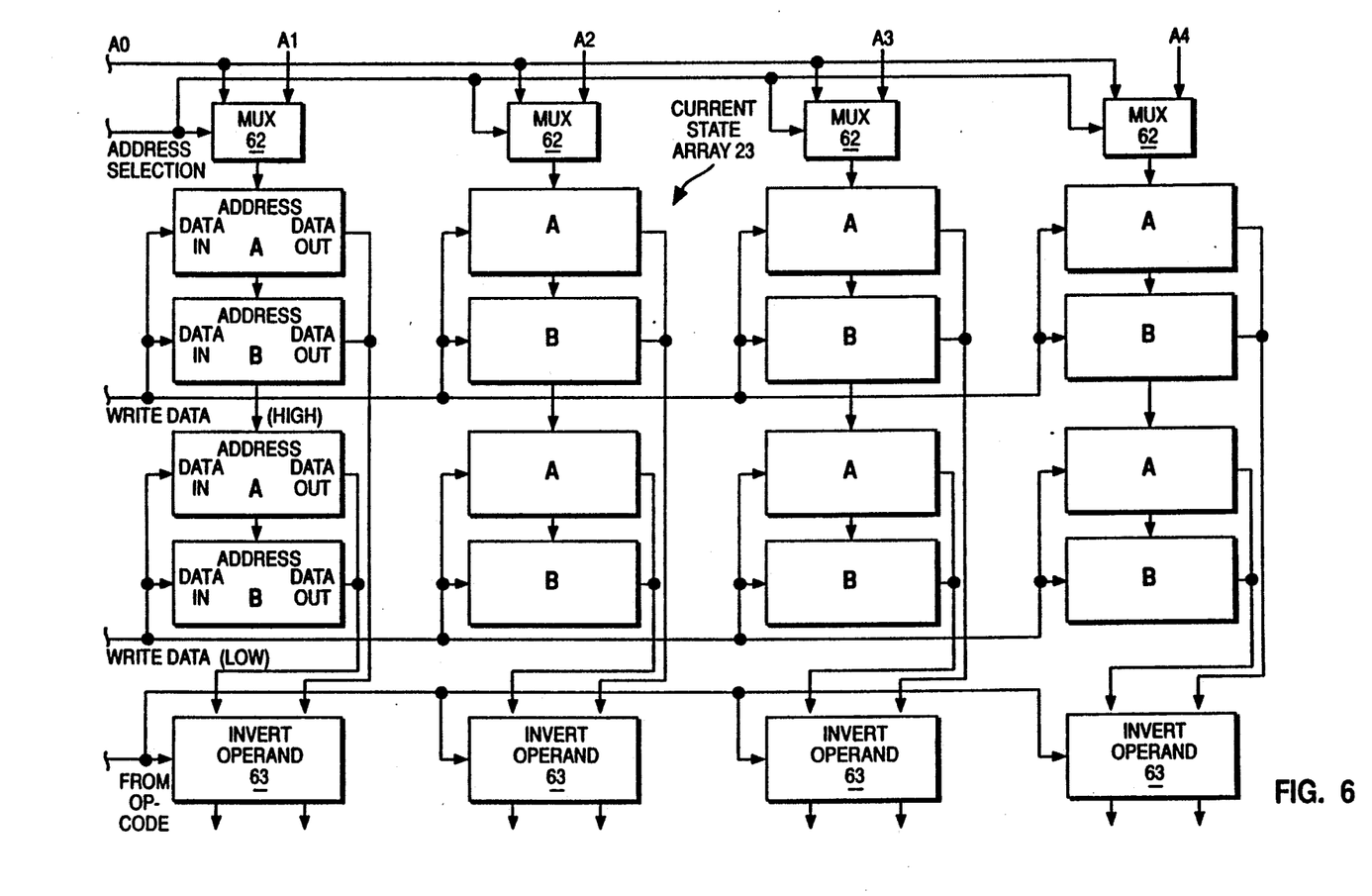
FIG. 6 is a schematic block diagram of a current state array of the simulation processor of FIG. 2.

Referring to FIG. 6, the current state array 23 is explained. The current state array 23 is a memory which stores a complete copy of current states of a whole model being simulated. The state of each block or gate is specified by 2 bits. The possible states are logical 0 (00), logical 1 (01), Undefined (10) and High Impedance (11). The current state array 23 stores such current states of all blocks or gates of the machine being simulated. There are 512K possible blocks or gates in the machine being simulated in this embodiment, so the state of the machine being simulated is contained in 1M bits. The current state array 23 must have 1M bit capacity at least. In this example, however, the current state array 23 is larger to achieve maximum performance. In the computation for a given block or gate, the contents of the current state array 23 are simultaneously addressed by the four fields A1, A2, A3 and A4. It is preferred to read the current states of four different blocks or gates simultaneously. Therefore, the array 23 is replicated 4 times. When reading the array 23, four different addresses can be read simultaneously. When writing the array 23, the same addresses in all four arrays are always written. That is, when the current state array 23 is read, the multiplexors 62 are controlled through an address selection by the control logic means 27 to output addresses A1, A2, A3, and A4 to each array. Then, each array outputs a 2-bit operand to an operand invert logic means 63. Each of the outputted operands may be inverted by the inversion bit of the op-code in the means 63 before calculation in the logical function table 24. When the current state array 23 is written, the multiplexors 62 are controlled through the address selection by the control logic means 27 to output one address A0. Then, the same data is written into the four arrays at the same address A0. Of course, this could been done using a single array and time-slicing, but at the expense of roughly 4 times performance. Furthermore, another 4 arrays are added in the example shown in FIG. 6. For unit delay simulation, the state of the machine being simulated need to be saved in a "master-slave" arrangement. That is, the complete next state of the machine needs to be computed before this becomes the current state of the machine. The simplest way to implement this is with two memory (A and B) operating in a ping-pong arrangement. When A contains the current state, B will be used to save the next state. When B contains the current state, A is used to save the next state.

Figure 7:
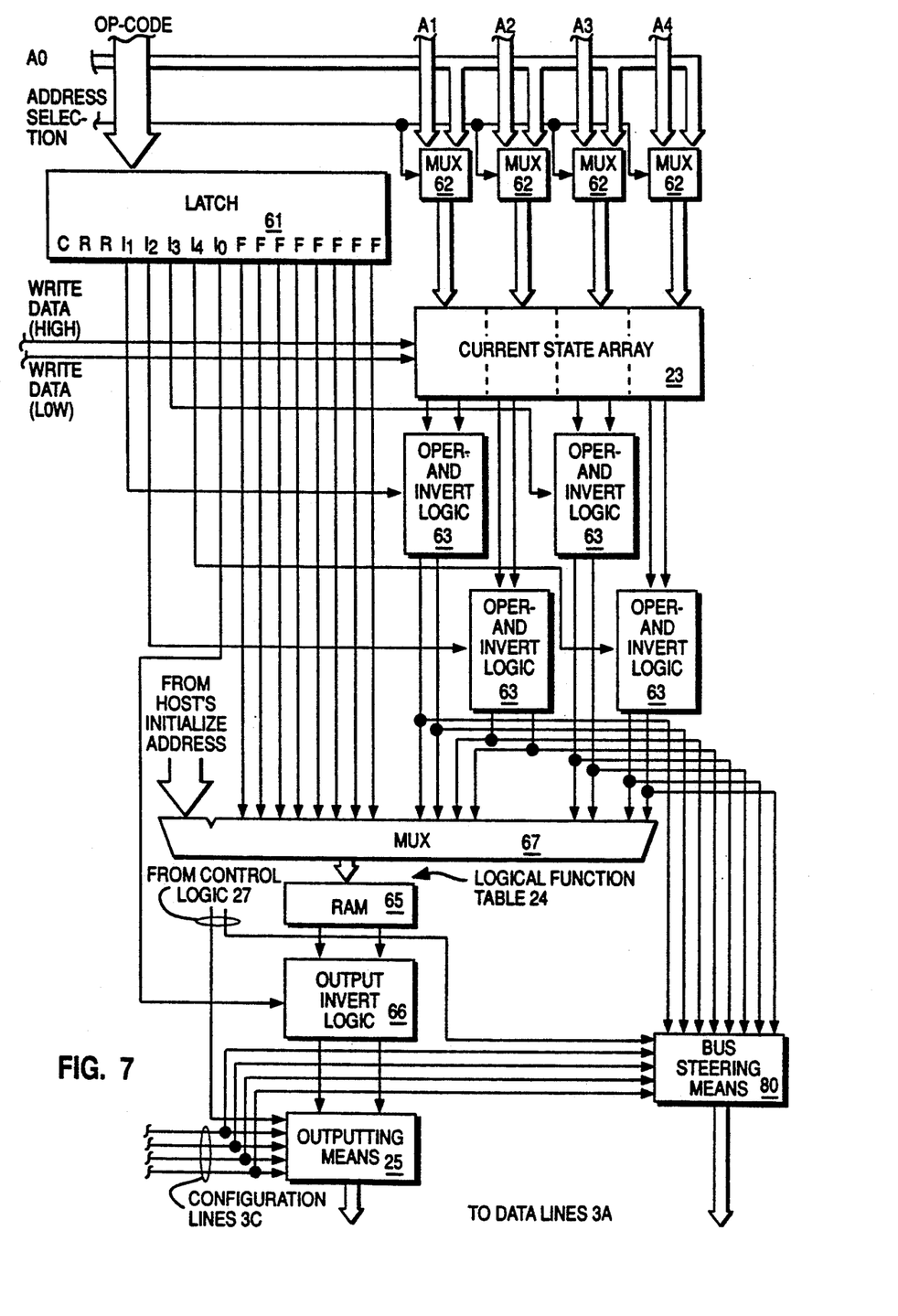
FIG. 7 is a detailed schematic block diagram of a part of the simulation processor of FIG. 2.

Referring to FIG. 7, the logical function table 24 is explained. The logical function table 24 is a programmable logic block whose main element is a memory 65, a 64K×2 bit static RAM, indexed by the 8-bit function pointer in the op-code field plus the four 2-bit input operands form the operand invert logic 63. The logical function table 24 generates a 2-bit output, which is the next state of the gate being evaluated. The RAM 65 is also accessible to the host computer 5 through a multiplexor 67, which needs to load it with a set of logical functions prior to beginning of the simulation. The logical function table 24 is in essence a look up table which generates a 2-bit output with respect to a given gate function and four input operands. The output of the logic function table 24 is supplied to the outputting means 25 through an output invert logic means 66. The output from the table 24 may be inverted in the output invert logic means 66 by the inversion bit of the op-code before being put on the allocated lines of the data lines 3A through the outputting means 25. The outputs from the operand invert logics 63 are also supplied to the bus steering means 80. When the Broadcast command is executed by the control logic 27, the bus steering means 80 receives four current states designated by A1 thru A4 fields of the command from the current state array 23 through the operand invert logics 63 and puts eight bit data on the data lines 0 thru 7, 8 thru 15, 16 thru 23, or 24 thru 31 under the control of the control logic 27. The data in the current state array 27 are sent to the host 5 by the Broadcast command from the simulation processors 2 for use in the host 5. The Broadcast command is the subject of the co-pending application U.S. Ser. No. filed and having internal docket No. AT9-89-098.

Figure 8:
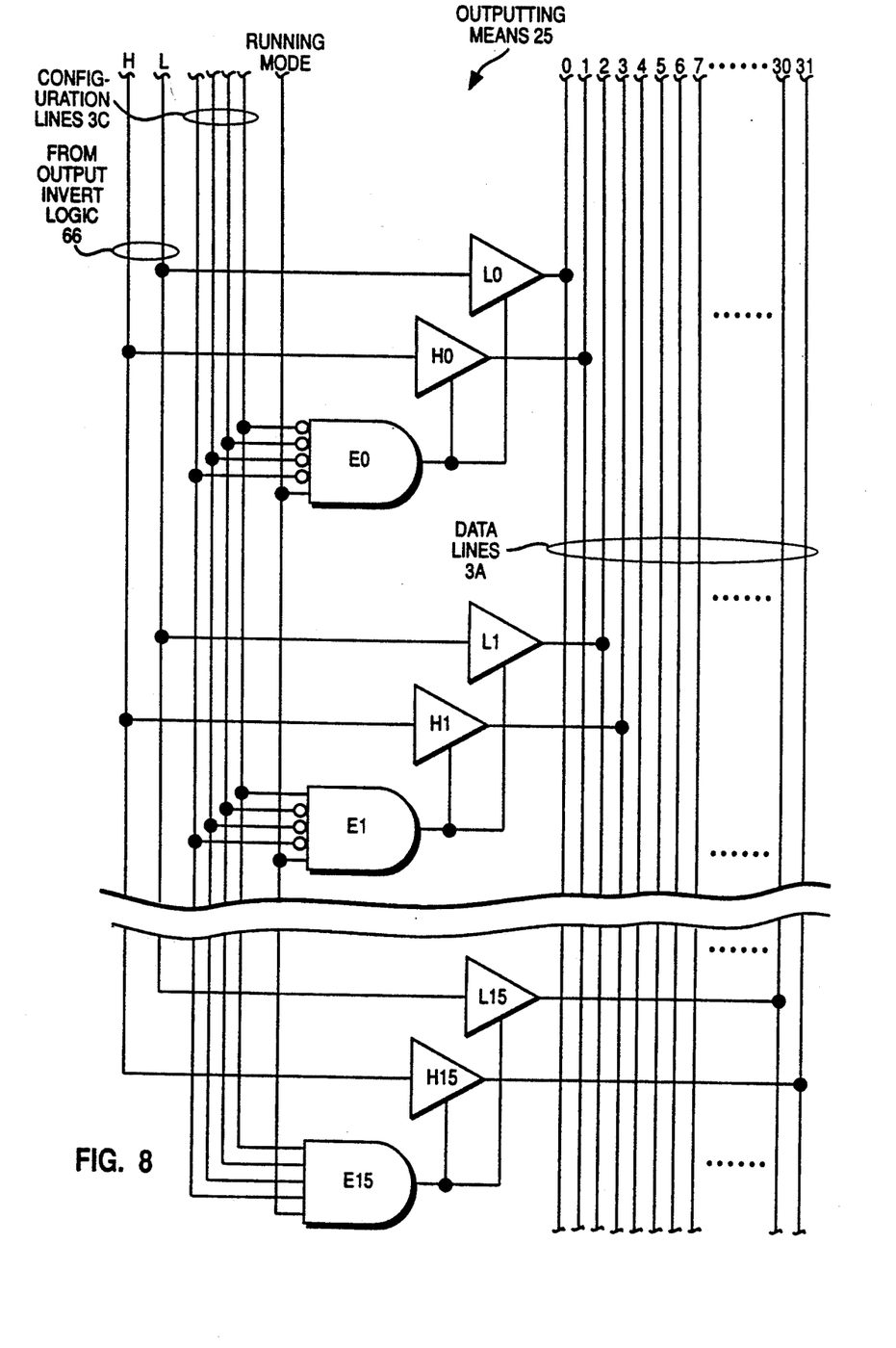
FIG. 8 is a schematic block diagram of an outputting means of the simulation processor of FIG. 2 for putting a result from the logic function table on allocated data lines of the simulation bus.

Referring to FIG. 8, the outputting means 25 is explained. The outputting means 25 comprises 16 AND gates E0, E1, ..., and E15, 16 gates L0, L1, ..., and L15 whose outputs are connected to the even number lines 0, 2, ..., and 30 of the data lines 3A, respectively, and 16 gates H0, H1, ..., and H15 whose outputs are connected to the odd number lines 1, 3, ..., and 31 of the data lines 3A, respectively. The configuration lines 3C which are connected to the hard wired means 3D and the control logic means 27 are connected to inputs of the AND gates E0, E1, ..., and E15. All inputs from the lines 3C to the gate E0 are inverted so that only the 4-bit binary data 0000 on the lines 3C can activate the gate E0. An input from the least significant bit line of the lines 3C is directly connected to the gate E1 and the other three inputs from the lines 3C to the gate E1 are inverted so that only the 4-bit binary data 0001 can activate the gate E1 and so on. All inputs from the lines 3C are directly connected to the gate E15 so that only the 4-bit binary data 1111 on the lines 3C can activate the gate E15. A running mode signal from the control logic 27 is also connected to input of each of the AND gates E0, E1, ..., and E15 to activate the AND gates during running mode of the simulation processors 2. Outputs of the AND gates E0, E1, ..., and E15 are connected to enable terminals of the gates L0 and H0, L1 and H1, ..., and L15 and H15, respectively. The low bit line of the output from the output invert logic means 66 is connected to inputs of the gates L0, L1, ..., and L15. The high bit line of the output from the output invert logic means 66 is connected to inputs of the gates H0, H1, ..., and H15. Accordingly, the simulation processors 2 plugged into the slot means 0, 1, 2, ..., and 15 put their calculated results on the lines 0 and 1, lines 2 and 3, lines 4 and 5, ..., and lines 30 and 31 of the data lines 3A through the outputting means 25, respectively. Thus, each simulation processor 2 is allocated two of the data lines 3A to put its result thereon, depending on which slot means of the simulation bus 3 that processor 2 occupies.

Referring back to FIG. 2, the control logic means 27 controls a clock means 68 so that all of the simulation processors 2 connected with the simulation bus means 3 synchronously execute their operations. The control logic means 27 controls the program counter 26 so that the program counter 26 generates addresses to output instructions from the block description array 22 and addresses to write the calculated results from all of the simulation processors 2 back into the current state arrays 23. The control logic means 27 control the control instructions, such as Branch, Broadcast, and Halt. The control logic means 27 also controls the simulation processor 2 to load the block description array 22 with instructions and the current state array 23 with initial states from the host computer 5 before simulation.

In addition, the simulation processor 2 occupying the slot 0 contains the host interface 21 to transfer data and instructions between the host 5 and the simulation processors 2. The host interface 21 is a First-In First-Out buffer to buffer data between the simulation bus means 3 and the host I/O bus means 56. When packet data comes from the host through the host interface 21, each of the simulation processors 2 takes its data off the simulation bus means 3. When packet data are sent to the host, control logic in the host interface 21 determines, by the contents of the control lines 3B, that the data on the data lines 3A is intended for the host and transfers the data to the host 5. The host interface means 21 allows the user to initialize the block description arrays 22 and the current state arrays 23 at the beginning of the simulation and test results at the end of the simulation. It may also allow the user to read and modify the contents of the current state arrays 23 during the simulation for enhanced simulation capability. The host interface is the subject of the co-pending application U.S. Ser. No. 07/502,147 filed on Mar. 30, 1990.

Now, referring back to FIGS. 1 and 2, the operation of the logic machine 1 is explained. The host computer 5 is used to personalize the simulation processors 2 on power-on operation, to load the simulation processors 2 with instructions and data before the simulation, to evaluate the results during and/or after the simulation, and to interface with user. The host computer 5 personalizes each of the simulation processors 2 directly through the I/O bus means 56. On personalization, the host counts the number of the simulation processors 2 plugged into the I/O slots and tells the simulation processors 2 the number. After the personalization, however, the host does not need to take care of the configuration of the simulation processors 2 as explained later. After the personalization, the host computer 5 communicates with the simulation processors 2 only through the host interface 21 provided in the simulation processor 2 plugged into the slot 0 of the simulation bus means 3 except power supply through the I/O slot.

Figure 9:
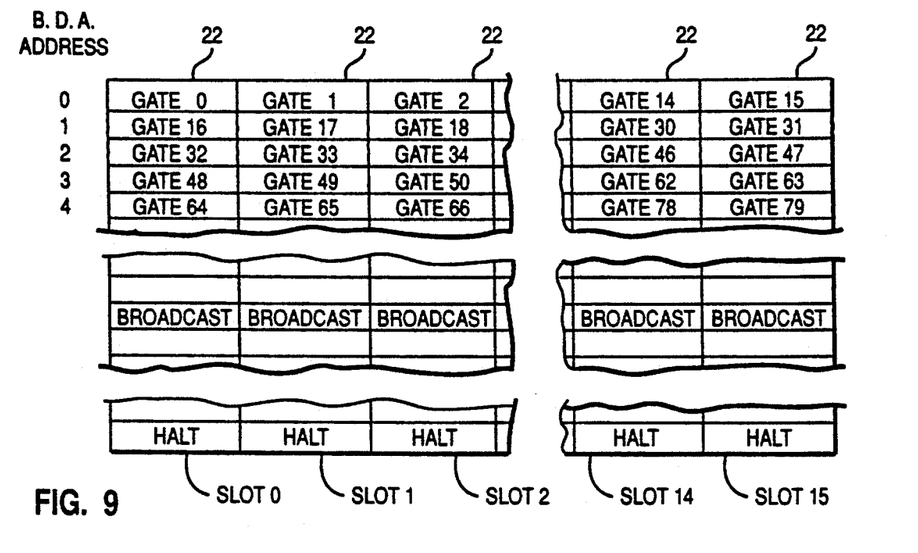
FIG. 9 is a simplified illustration of the block description arrays of the simulation processors in the machine of FIG. 1 to explain operation of the machine.

When loading the instructions into the block description array 22 of each of the simulation processors 2, the host computer 5 sends instructions to the simulation bus means 3 through the I/O bus 56 and the host interface 21. Each simulation processor 2 takes by turns the instructions and stores them into the block description array 22. Thus, as shown in FIG. 9, the simulation processors 2 plugged into the slot means 0, 1, ..., and 15 store consecutively the block description instructions for gates 0, 16, 32, . . . , gates 1, 17, 33, . . . , and gates 15, 31, 47, . . . , in their block description arrays 22, respectively, and store the same control instructions at the same addresses in the block description arrays 22.

Referring back to FIGS. 1 and 2 again, the host computer 5 loads the same initial states of a whole model to be simulated by the machine 1 into the current state array 23 in each of the simulation processors 2. In the embodiment, the current state array 23 in each simulation processor 2 maintains a complete copy of current states of the whole model being simulated during the simulation as explained later. The host computer also loads the same functional data into the logical functional table 24.

There are two modes in operation of the simulation, running and stopped. When running mode, each simulation processor 2 continuously steps through its block description array 22, evaluating each gate's next state, until it receives a command to stop that can be either imbedded in the block description array 22 or come from the host computer 5. In the stopped mode, no simulation is occurring, and the entire state of the logic simulation machine 1 including the current state array 23 and the block description array 22 is available for inspection and modification by the host computer 5.

In the running mode, this logic simulation machine 1 allows the sixteen simulation processors 2 to work on one simulation model to speed up simulation. In a parallel configuration, each simulation processor 2 evaluates one gate per cycle. At the end of the cycle each simulation processor 2 puts its result on the allocated lines of the data lines 3A in parallel and all simulation processors 2 update their current state arrays 23 with the results from the data lines 3A.

At each cycle of the running mode, the following steps are synchronously performed in each simulation processor 2 which is plugged into the simulation bus means 3 until a Halt command is found from the block description array 22 or the host computer 5 stops the simulation.

The control logic means 27 sequentially increments the program counter 26 from a start address to sequentially output instructions from the block description array 22. When the block description array 22 is addressed by the program counter 26, it outputs an instruction stored in the corresponding address. The op-code field of the instruction is latched by a latch 61. The op-code field indicates whether it is a block description instruction or a control instruction. If it is a block description instruction, the op-code field describes the function of the gate being evaluated. The fields A1 thru A4 specify four input connections of the gate being evaluated and correspond to addresses in the current state array 23 where the current states of the input connections are stored.

The addresses A1 thru A4 are passed to the array 23 through the multiplexors 62. Four 2-bit current states that are input operands to the gate being evaluated are simultaneously fetched from the addresses designated by the fields A1 thru A4. These input operands are sent to the operand invert logic means 63 so that the operands are inverted if the op-code indicates before the calculation in the logical function table 24.

The input operands to the gate being evaluated are sent to the logical function table 24. This information, along with the function pointer of the op-code field describing the gate's function from the latch 61, serves as a pointer into the logical function table 24. The logical function table 24 is in essence a look up table, and generates a proper 2-bit output value for the gate given its present inputs.

The output of the logical function table 24 is sent to the output invert logic 66 so that the output is inverted if the op-code indicates. The result from the output invert logic means 66 is supplied to the outputting means 25 to be put on the allocated lines of the data lines 3A in order to update all the current state arrays 23 in the machine 1 with the result.

For example, the AND gate shown in FIG. 5 is evaluated as follows: The program counter 26 of the simulation processor plugged into the slot 0 generates an address Z to fetch the block description instruction of the gate from the block description array 22. Four operands H(0,1), H(0,1), L(0,0), and L(0,0) are fetched from the addresses V, W, X, and Y in the current state array 23 as designated by the fields A1 thru A4 of the block description instruction. The first and the second input operands H(0,1) and H(0,1) are inverted to L(0,0) and L(0,0) in the operand invert logic 63 by the op-code. All four L(0,0) input operands and an function pointer specifying AND function are inputted to the table 24. The table 24 outputs a result, L(0,0). This result is inverted to H(0,1) in the output invert logic means 66 by the op-code. The output H(0,1) is supplied to the outputting means 25 to transfer to all the simulation processors 2 to update their current state arrays 23.

As explained before, the processors 2 in the slot 0, 1, 2, . . . , and 15 put their 2-bit results on the allocated lines 0 and 1, 2 and 3, 4 and 5, . . . , and 30 and 31 of the data lines 3A, respectively. In this way, all results calculated in this cycle appear on the data lines 3A in parallel. The results on the data lines 3A are received by the control logic means 27 and are written back to 16 adjacent addresses beginning at an address designated by the product of the simulation cycle number and the number of the simulation processors in the configuration (16 in this embodiment), in the current state array 23 in each of the processors 2 at the end of each simulation cycle. For example, at the end of the first simulation cycle, addresses 0 thru 15 in the current state arrays 23 of all the simulation processors are updated with results on the data lines 3A. At the end of second simulation cycle, addresses 16 thru 31 in the current state array 23 are updated with results on the lines 3A. At the end of the third simulation cycle, addresses 32 thru 47 and so on. In this way, the current state array 23 in each simulation processor 2 is updated with the results calculated at each simulation cycle by all of the processors 2 and keeps a complete copy of current states of the model being evaluated in the machine 1. The host computer 5 can receive the results through the data lines 3A and the host interface 21 during the simulation by the Broadcast command and/or after the simulation from the current state array 23 of the processor 2 plugged into the slot 0.

When the simulation processors 2 execute the control instructions, Branch, Broadcast, Halt, etc., the identical control instructions are executed simultaneously in all of the simulation processors 2 for proper synchronization of the simulation. For, example, Branches are resolved identically across all simulation processors 2 at a time.

In this machine 1, plural simulation processors 2 work on a simulation model in parallel to speed up the simulation, this allows an almost linear speedup, that is, twice as many simulation processors run twice as fast. The non-linearity of the speedup is only due to the updating requirement, since a higher proportion of time will be spent writing data back into the current state arrays. Although 16 simulation processors 2 are connected with the simulation bus means 3 in this example, any number of simulation processors selected from the group consisting of 1, 2, 4, 8, and 16 is able to be connected with the simulation bus means 3 depending on a desired performance. The configuration of the simulation processors 2 is kept transparent from the host computer 5 and the same model built for the largest configuration can be used irrespective of the changes in the configuration because the control logic 27 and the configuration lines 3C inform the simulation processors of the configuration to take care of the configuration change by themselves. And after the personalization of the simulation processors 2, the host computer 5 communicates with the logic simulation machine 1 through the host interface 21 of the processor 2 plugged into the slot 0 of the simulation bus means 3. Then, the group of the simulation processors 2 appear to the host computer 5 as a single entity with respect to a number of tasks; building the simulation model, loading it into the simulator, running the simulation, and retrieving the results for analysis.

Figure 10:
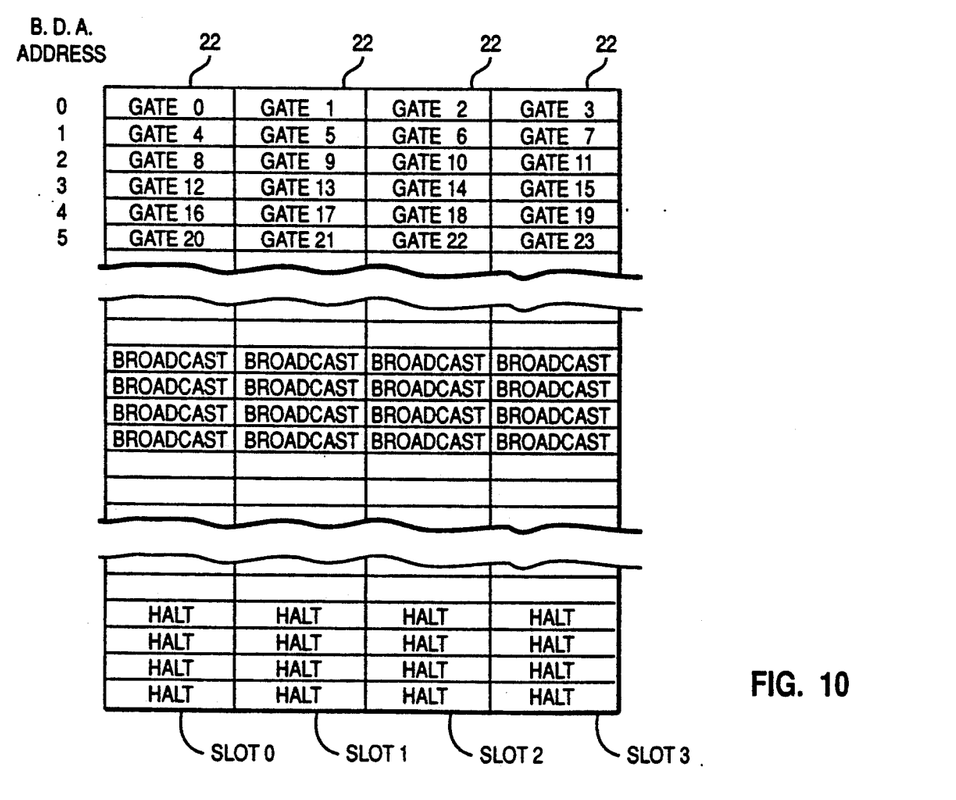
FIG. 10 is a simplified illustration of the block description arrays of another configuration of the logic simulation machine.

If four simulation processors 2 are connected with the simulation bus means 3 instead of sixteen simulation processors, the four simulation processors 2 are plugged into the slots 0, 1, 2, and 3 and receive unique data from the configuration lines 3C, respectively. When loading of the instructions into the block description array 22 in each of the simulation processors 2, each simulation processor 2 receives by turns and stores the instructions in the block description arrays 22 as shown in FIG. 10.

Four gates are evaluated at one simulation cycle in this configuration. The results of the four gates evaluated by the four processors 2 are put on the lines 0 thru 7 of the data lines 3A in parallel at the end of the first cycle of every four cycles, on the lines 8 thru 15 at the end of the second cycle of every four cycles, on the lines 16 thru 23 at the end of the third cycle of every four cycle, and on the lines 24 thru 31 at the end of the forth cycle of every four cycle. This is done by sending from the control logic 27 (0,0) at the first cycle, (0,1) at the second cycle, (1,0) at the third cycle, and (1,1) at the forth cycle on the most and the second significant bit lines of the configuration lines 3C in FIG. 8. At the end of the forth cycle, all the data lines 3A have the results and the results are written back to sixteen adjacent addresses in the current state array 23 beginning at an address designated by the product of the first simulation cycle number of every four cycles and the number of the simulation processors, that is, four. Namely, at the end of every four cycles when all the data lines 3B are filled with the results from the processors 2, the current state array 23 in each of the simulation processors 2 are updated with the results on the data lines 3B. This configuration needs four simulation cycles to evaluate the same sixteen gates while the configuration of FIG. 1 needs one simulation cycle. In the four processor configuration as shown in FIG. 10, each block description array 22 has four identical control instructions in four adjacent addresses. Each control logic means 27 in the processors 2 executes the first Branch or Halt control instruction of the four identical control instructions and neglects the other three redundant identical control instructions since the four Branch or Halt commands have the same contents. However, all Broadcast instructions are executed by the processors 2 since each of the sixteen Broadcast commands contains different operands in the fields A1 thru A4 to transfer data from the array 23 to the host 5.

The machine 1 makes the number of simulation processors transparent to software. This means that architecturally 16 block description instructions are always executed simultaneously. In fact, this may take 1, 2, 4, 8, or 16 cycles, depending on the number of the simulation processors, but the software does not see a difference. When the host computer accesses the block description arrays in the simulation processors for loading or other purposes, it sees simply one set of instructions. Physically, the hardware of the simulation processors may direct the host's accesses to different arrays on multiple cards, but the host does not see this. If a logic model to be simulated is built for the largest configuration of the logic simulation machine the model will run on any smaller configuration without any modification. This concept allows the same model to be used across many hardware configurations. The host does not need to know the configuration but just sends all host data to the I/O bus regardless of the configuration. This is important particularly because the architecture of this example allows the user to reconfigure the logic simulation machine at any time in order to get a desired performance.

In the simulation, the simulation processors 2 will normally be used to simulate only gate logic, functions such as memory or array modelling and device behavioral will be performed by the host computer 5. However, in the machine 1 shown in FIG. 1, all data to and from the host computer 5 goes on the simulation bus means 3, the host becomes just another device on the bus 3. This implies that any host function can be done by a hardware accelerator or an auxiliary processor which is plugged into the simulation bus means 3 in parallel with the simulation processors 2 by mimicking the traffic on the simulation bus 3. Obvious candidates for the hardware accelerator or the auxiliary processor is trace collection, memory or array simulation, and device behavioral, where the host may be slowing down the simulation throughput. In fact, all functions except user interface could be migrated to an auxiliary processor to relieve such a host work.

The all events trace (AET) gatherer 4 of the invention is an example of such an auxiliary processor. An all events trace (AET) is a record of what has happened to all of the facilities during a simulation. The AET data is normally collected by having the host computer 5 evaluate all of the nodes to be traced at the end of each simulation cycle in the prior art. Even with the efficiencies of the Broadcast command to send only those nodes of interest to the host, two limitations remain. First all of the nodes to be traced are sent to the host computer, even those that did not change. Second, it places a considerable time requirement on the host to evaluate the data every simulation cycle. The AET gatherer 4 generates an AET data in parallel with the simulation to relieve the host task.

Figure 11:
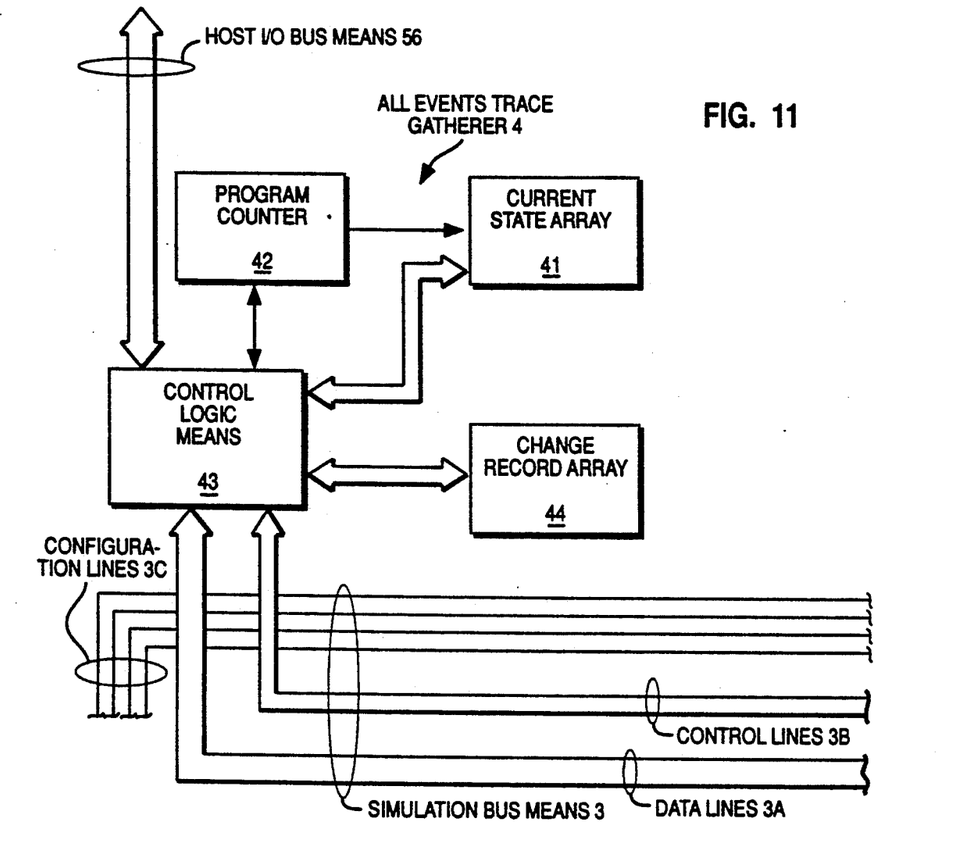
FIG. 11 is a schematic block diagram of an all events trace (AET) gatherer according to a preferred embodiment of the invention, which is connected by the simulation bus means in parallel with the simulation processors to the logic simulation machine to generate an all events trace (AET) during a simulation.

Referring to FIG. 11, the AET gatherer 4 according to a first embodiment of the invention is explained. The AET gatherer 4 has the same components as those of the simulation processor 2, that is, a current state array 41 that keeps a complete copy of current states of the whole model being simulated by monitoring the simulation bus means 3 and a program counter 42 which is synchronized with the simulation processor 2. In addition, the AET gatherer 4 has its control logic means 43 and a change record array 44 to store only changes in the model being simulated. The current state array 41 is constituted by one array and does not need to have four or eight identical arrays as the simulation processors 2. The current state array 41 is updated with calculated results on the data lines 3B at the end of each simulation cycle in the same way as the current state array 23 in the processors 2.

At the beginning of each simulation cycle, the control logic 43 puts a marker in the change record array 44 to indicate the cycle begin point. As simulation progresses, the control logic 43 monitors the simulation bus means 3 to keep a complete copy of the current states in the current state array 41. By comparing the new values of each node address as they are generated against the old value in the current state array 41, the control logic 43 detects a change in the node. Whenever a change is detected, the control logic 43 stores the node address and new node value in the change record array 44.

Figure 12:
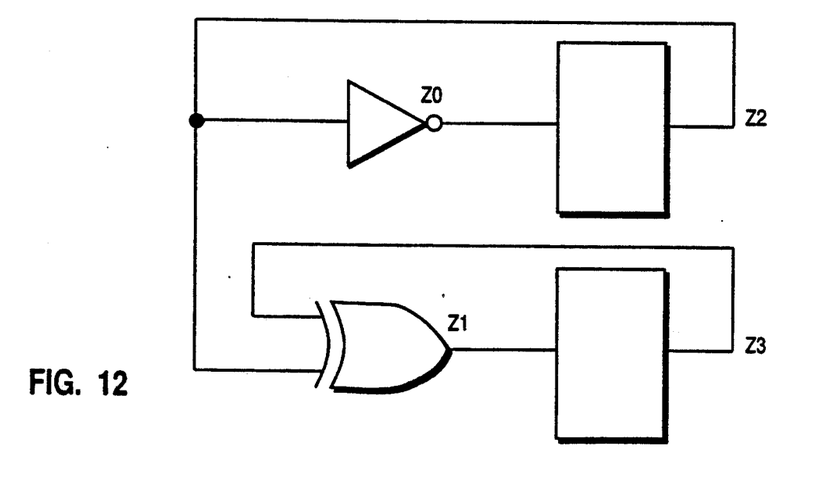
FIG. 12 is a schematic diagram of a 2-bit counter to be simulated by the machine of FIG. 1 to explain operation of the all events trace (AET) gatherer of FIG. 11.
Figure 13:
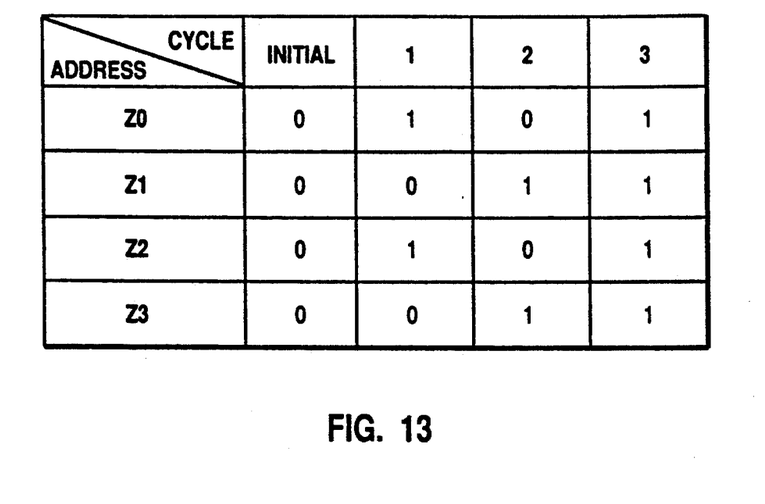
FIG. 13 is a table to explain the current states of nodes in the counter of FIG. 12 at each simulation cycle.
Figure 14:
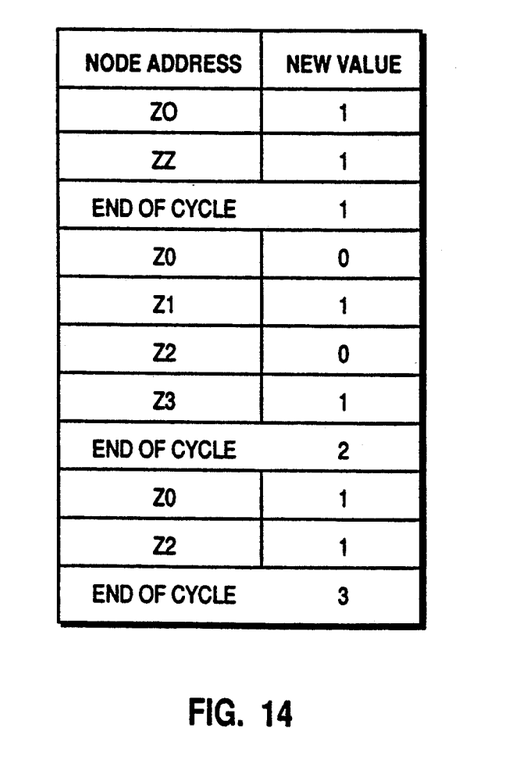
FIG. 14 is a table showing contents of a change record array to explain the operation of the all events trace (AET) gatherer of FIG. 11.

Referring to FIGS. 12, 13 and 14, operation of the AET gatherer 4 is explained. FIG. 12 shows a design model, a two-bit counter, to be simulated by the simulation processors 2 in the logic simulation machine 1. There are four nodes Z0, Z1, Z2 and Z3 to be evaluated. FIG. 13 shows the states of all the nodes in the current state array 41 at the end of each simulation cycle, all nodes in the model having been evaluated once. FIG. 14 shows the contents of the change record array 44 after three simulation cycles. Only changed nodes and new values are stored in the change record array 44.

Figure 15:
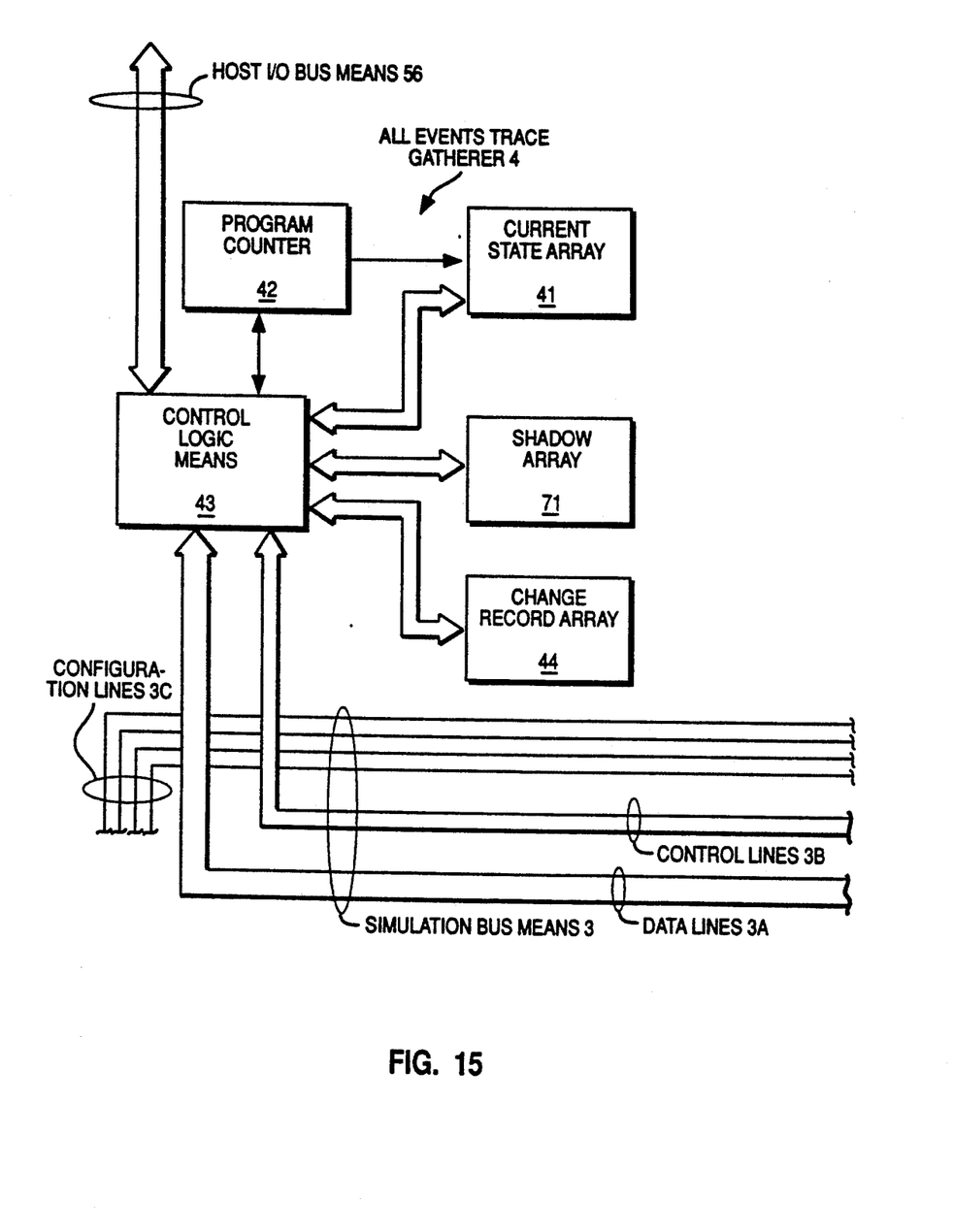
FIG. 15 is a block diagram showing an all events trace (AET) gatherer according to a second embodiment of the invention.

Any subset of all facilities can be traced by keeping another (shadow) array equal in size to the current state array 41 that is used as a mask. A bit must be on the shadow array for the node to be traced. FIG. 15 shows an AET gatherer 4 according to a second embodiment of the invention to trace any subset of all facilities during the simulation. The AET gatherer 4 includes the same components as those in FIG. 11 in addition to the shadow array 71 which has the same size as the current state array 41 to store a bit for indicating the node to be traced so that any subset of all facilities can be traced. The shadow array 71 is used as a mask when the control logic 43 examines a change between the current states stored in the current state array 41 and the calculated results from the simulation bus 3 to generate the AET records for a subset of all facilities. The shadow array may be constituted by one of four identical arrays of the current state array 23 of the processor 2.

The AET gatherer 4 is a passive auxiliary processor which only monitors the simulation bus means 3. The only time it affects the simulation is if it must halt simulation to dump the change record array 44 to the host. This should happen rarely if ever, and can be avoided entirely if the host has bandwidth to handle both the simulation and AET dump. Since AET gatherer 4 is recording a minimum of information (changes only), if the change record array 44 is large enough and the number of facilities to be traced is reasonable, most simulation cases can be completed before the AET dump is required. The AET gatherer 4 generates the AET by monitoring the simulation bus 3 without slowing down the tasks of the simulation processors and of the host computer and also allows any subset of facilities to be collected by using the shadow array storing a mask which indicates which nodes are to be traced.

In the logic simulation machine of FIG. 1, the number of the simulation processors connected to the simulation bus means is $2^n$ and the maximum number is sixteen. However, the AET gatherer of the invention is able to be attached to a logic simulation machine which contains any number of the simulation processors so that the AET gatherer monitors the data on the simulation bus means in order to gather an AET in parallel with the simulation.

While the invention has been particularly shown and described with reference to preferred embodiments thereof, it will be understood by those skilled in the art that changes in form and details may be made therein without departing from the spirit and scope of the invention.

What is claimed is:

1. An all events trace gatherer, comprising:
   a simulation bus;
   a plurality of simulation processors for simulating a model in parallel, each processor putting a simulated result on the simulation bus in parallel;
   a current state store means for storing current states of the model being simulated by the multiple simulation processors in parallel;
   a change record means for storing all changes in the current states of the model being simulated by the multiple simulation processors in parallel over a plurality of simulation cycles; and
   a control means, coupled to said simulation bus, for monitoring the current states of the model being simulated to detect a change in the current states stored in the current state store means and store the change into the change record means.

2. The all events trace gatherer according to claim 1, further including:
   a memory means equal in size to the current state store means for storing a mask which indicates which node to be traced to trace a subset of all facilities during a simulation.

3. A method of gathering all events trace during logic simulation including a current state store means and a change record means, comprising the steps of:
   simulating a model with a plurality of parallel simulation processors, each processor putting a simulated result on a simulation bus in parallel;
   storing current states of the model being simulated by the plurality of parallel simulation processors in the current state store means;
   monitoring on the simulation bus the current states of the model being simulated to detect all changes in the current states stored in the current state store means over a plurality of simulation cycles; and
   storing all the changes into the change record means.

4. The method according to claim 3, wherein the logic simulation machine further includes a plurality of simulation processors and a simulation bus means on which each simulation processor puts a simulated current state, further including the step of:
   receiving the simulated state from the simulation bus means.

5. The method according to claim 3 wherein the logic simulation machine further includes a memory means equal in size to the current state store means, further including the step of:
   storing, in the memory means, a mask means for indicating which node to be traced to trace a subset of all facilities during a simulation.

6. An all event trace gatherer comprising:

a simulation bus means;

a plurality of simulation processors for simulating a model in parallel, each processor putting a simulated result on the simulation bus means in parallel;

a current state store means for storing current states of the model being simulated from the simulator bus means;

a change record means for storing all changes in the current states of the model over a plurality of simulation cycles; and a control means for monitoring the current states of the model being simulated from the simulation bus means to detect all changes in the current states stored in the current state store means and store all the changes into the change record means.

7. The all events trace gatherer according to claim 6 wherein each of the simulation processors includes outputting means for providing its simulated current state on the simulation bus means in parallel.

8. The all events trace gatherer according to claim 6, further including:

a memory means equal in size to the current state store means for storing a mask which indicates which node to be traced to trace a subset of all facilities during a simulation.

9. The all events trace gatherer according to claim 6 wherein the gatherer is connected to the simulation bus means in parallel with the plurality of the simulation processors to receive the simulated current states from the insulation processors through the simulation bus means.

* * * * *